(12) United States Patent
Hasan

(10) Patent No.: US 9,928,544 B1
(45) Date of Patent: Mar. 27, 2018

(54) VEHICLE COMPONENT INSTALLATION PREVIEW IMAGE GENERATION

(71) Applicant: Amazon Technologies, Inc., Seattle, WA (US)

(72) Inventor: Shiblee Imtiaz Hasan, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 432 days.

(21) Appl. No.: 14/644,030

(22) Filed: Mar. 10, 2015

(51) Int. Cl.
  *G06T 15/00* (2011.01)
  *G06Q 30/06* (2012.01)
  *G06F 3/0481* (2013.01)
  *G06T 19/00* (2011.01)

(52) U.S. Cl.
  CPC ..... *G06Q 30/0643* (2013.01); *G06F 3/04815* (2013.01); *G06T 19/003* (2013.01); *G06T 2219/004* (2013.01); *G06T 2219/2016* (2013.01)

(58) Field of Classification Search
  CPC .............. G06Q 10/20; G06F 17/30256; G06F 17/5095; G06F 17/30784; G07C 5/008; G07C 2205/02
  USPC ........................................................ 345/419
  See application file for complete search history.

(56) References Cited

U.S. PATENT DOCUMENTS

| | | | |
|---|---|---|---|
| 7,121,469 B2 | 10/2006 | Dorai et al. | |
| 7,908,123 B2 * | 3/2011 | Maebayashi | G06Q 10/06 700/97 |
| 8,315,423 B1 | 11/2012 | Jing et al. | |
| 8,688,422 B2 * | 4/2014 | Hanke | G06Q 10/00 703/6 |
| 8,725,573 B1 | 5/2014 | Narang et al. | |
| 8,725,595 B1 | 5/2014 | Siegel et al. | |
| 2003/0055674 A1 * | 3/2003 | Nishiyama | G06Q 10/06 703/8 |
| 2005/0044011 A1 | 2/2005 | Deal | |
| 2006/0167630 A1 * | 7/2006 | Noma | G06F 17/5095 701/117 |
| 2008/0077511 A1 | 3/2008 | Zimmerman | |
| 2010/0042952 A1 * | 2/2010 | Geesey | G06Q 50/30 715/851 |

(Continued)

OTHER PUBLICATIONS

Prochazka, David, et al. "Mobile augmented reality applications." arXiv preprint arXiv:1106.5571 (2011).*

(Continued)

*Primary Examiner* — Kimberly A Williams
(74) *Attorney, Agent, or Firm* — Knobbe, Martens, Olson & Bear, LLP

(57) ABSTRACT

Systems and processes described herein can identify interface points for an item in an image and generate a preview image that illustrates one or more additional items interfacing with at least one of the identified interface points. The system described herein can use augmented reality to present the preview image of an additional item connected to the item at the at least one identified interface point. Further, the system described herein can use a three-dimensional model created based at least in part on measurements of the additional item and a determination of the size of the item from context or reference information within the image to confirm that the additional item will fit the interface point of the item within a threshold degree of fit.

21 Claims, 7 Drawing Sheets

(56) References Cited

U.S. PATENT DOCUMENTS

| | | | |
|---|---|---|---|
| 2010/0223163 A1* | 9/2010 | Edwards | G06F 17/30256 |
| | | | 705/29 |
| 2010/0287511 A1* | 11/2010 | Meier | G06T 15/20 |
| | | | 715/848 |
| 2012/0053754 A1* | 3/2012 | Pease | B60R 16/023 |
| | | | 701/1 |
| 2012/0230548 A1* | 9/2012 | Calman | G06K 9/00791 |
| | | | 382/104 |
| 2013/0258117 A1 | 10/2013 | Penov et al. | |
| 2013/0301875 A1* | 11/2013 | Schumacher | G06K 9/00 |
| | | | 382/103 |
| 2014/0244430 A1 | 8/2014 | Siegel et al. | |
| 2016/0019615 A1* | 1/2016 | Hart | G06Q 30/0611 |
| | | | 705/26.4 |
| 2017/0031997 A1* | 2/2017 | Merg | G06F 17/30528 |

OTHER PUBLICATIONS

Zimmermann, Peter. "Virtual reality aided design. A survey of the use of VR in automotive industry." Product Engineering (2008): 277-296.*

Regenbrecht, Holger, Gregory Baratoff, and Wilhelm Wilke. "Augmented reality projects in the automotive and aerospace industries." IEEE Computer Graphics and Applications 25.6 (2005): 48-56.*

Henderson, Steven J., and Steven K. Feiner. Augmented reality for maintenance and repair (armar). Columbia Univ New York Dept of Computer Science, 2007.*

U.S. Appl. No. 14/579,536, filed Dec. 22, 2014, Masters et al.
U.S. Appl. No. 14/579,417, filed Dec. 22, 2014, Hasan et al.
U.S. Appl. No. 14/579,522, filed Dec. 22, 2014, Masters et al.

* cited by examiner

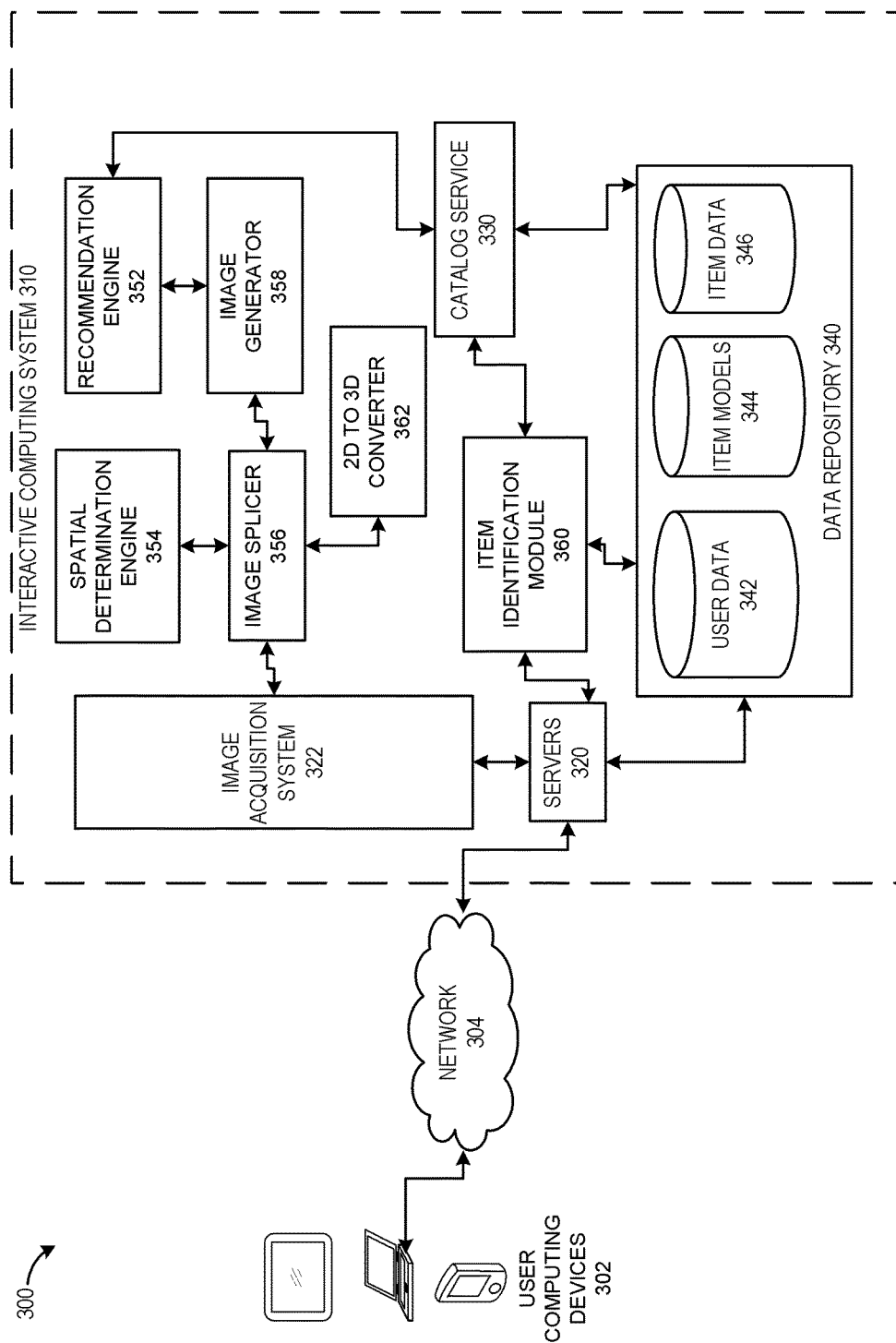

VEHICLE COMPONENT INSTALLATION PREVIEW IMAGE GENERATION

BACKGROUND

Vehicles, such as cars or other automobiles, are generally manufactured according to design specifications created by entities that specialize in designing the vehicles. Typically, only a few design specifications (and sometimes only one design specification) are created for a particular vehicle. A large quantity of the vehicles may then be manufactured according to the design specification(s) for sale or lease to customers.

Some customers are not satisfied with the original design specification for their vehicle. These customers, sometimes referred to as vehicle or car enthusiasts, may seek to modify their vehicles by purchasing and installing aftermarket vehicle components. As a result, a number of manufacturers, information sources, and organizations (e.g., fan clubs) have been created that are devoted to helping customers modify their vehicles.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIG. 3 is a block diagram illustrating an embodiment of a networked computing environment for implementing features described herein.

DETAILED DESCRIPTION

Introduction

Figure 1A:
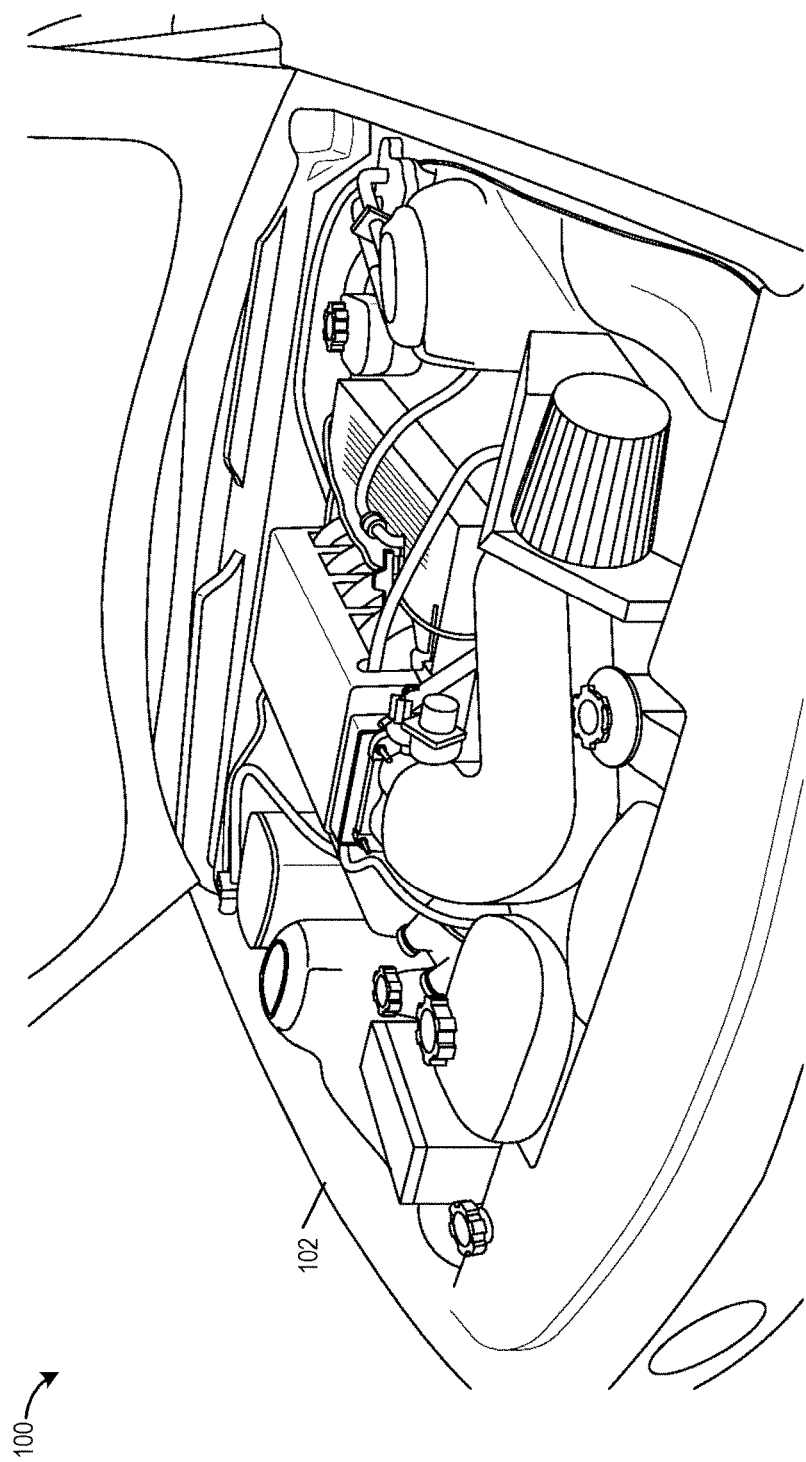
FIG. 1A is a pictorial diagram illustrating an example of a portion of a vehicle, including an engine compartment.

It can be difficult for a user to determine whether a vehicle component will have the look and feel that the user desires when installed on the user's vehicle. Further, because many aftermarket vehicle components may be manufactured by a different manufacturing entity than the manufacturer of the vehicle, it can be difficult to know whether a particular vehicle component will fit or function with a particular vehicle. In some cases, the component manufacturer may advertise that a particular component will work with a number of vehicle models. However, in some cases, the particular component may only work with a subset of the identified vehicle models or may not fit certain identified vehicle models as well as other identified vehicle models.

One solution to the above identified problems is to use augmented reality techniques to enable a user to preview a particular vehicle component with respect to the user's vehicle. Further, using augmented reality techniques discussed herein, it is possible to confirm that a particular vehicle component will fit or is likely to fit a particular vehicle model.

Embodiments of systems and processes described herein can identify interface points for an item in an image and generate a preview image that illustrates one or more additional items interfacing with at least one of the identified interface points. Advantageously, in certain embodiments, the user can use the preview image to confirm whether the user would like to obtain the one or more additional items to use in conjunction with the item in the image. The preview image may be presented to the user on a display of a user computing device, which may have been used to capture the image that depicts the item. In some cases, augmented reality techniques may be used to present the preview image at substantially the same time as the user computing device is capturing additional images (e.g., additional frames) of the item.

Augmented reality techniques can enable a user to view a modified version of an image that differs from an image being captured by the computing device capturing the image. Often, but not necessarily, the modified image being displayed to the user is presented at substantially the same time as the original image is captured. In some cases, a time lag may exist between the display of the modified image and the capturing of the initial image. This time lag may be due to processing time of the initial image to create the augmented reality image, or modified image. Often, the time lag is imperceptible to a human user. Additional embodiments of augmented reality techniques that may be used herein to preview an item used in conjunction with another item are described in the following applications, which are each incorporated by reference in their entirety herein: U.S. application Ser. No. 14/579,536, filed on Dec. 22, 2014 and titled "IMAGE-BASED COMPLEMENTARY ITEM SELECTION"; U.S. application Ser. No. 14/579,417, filed on Dec. 22, 2014 and titled "ITEM PREVIEW IMAGE GENERATION"; and U.S. application Ser. No. 14/579,522, filed on Dec. 22, 2014 and titled "IMAGE-BASED ITEM LOCATION IDENTIFICATION."

The interface points may include one or more portions of an item that enable the item to attach to, communicate with, or function with one or more additional items. An interface point may be a point of contact or access with the item, but is not limited to a point and may include any type of access location or feature of the item. In some cases, an interface point may be referred to as a connection point or an access point. Although the interface point is generally physical, in some cases, the interface point may be logical.

Embodiments described herein can be applied to a variety of items. However, to simplify discussion, embodiments herein are described in the context of vehicles and items that may be used with or installed on or in a vehicle. The type of vehicle is not limited and may include a car, a boat, an airplane, a train, a motorcycle, a wagon, a bicycle, etc. Further, items that may be used or installed on the vehicle are not limited in type and may include items that change or modify the functionality, the specification, or the aesthetic appeal of the vehicle. In some cases, the items may be replacements for existing items or parts of the vehicle. For example, the items may include new headlight bulbs, new brake calipers, or new body paint.

Embodiments described herein enable a system to confirm that an item designated as being capable of functioning with a second item can function with the second item. In other words, in some embodiments, systems described herein can confirm and/or determine within a degree of likelihood or probability that one item will fit or function with another item. Thus, the systems herein can determine whether a vehicle component will fit on a particular vehicle. This determination may be made by using a model, typically a three-dimensional model, of an item and positioning the model with respect to a model of the vehicle to determine whether the item fits the vehicle within a threshold degree of fit. In some cases, an access point of the item may be aligned with an access point of the vehicle to determine whether the item fits the vehicle. The model for the item may be generated based at least in part on precision measurements performed with respect to an instance of the item. The precision measurements may be obtained by using a device that can measure an item within a threshold degree of tolerance, such as a laser-based measurement device.

Similarly, the dimensions of the vehicle may be determined based at least in part on precision measurements. For example, one instance of a particular car model (such as a car with a known make, model and year) may be precisely measured, then these measurements may be used for other instances of the given car model that are later recognized in an image. Alternatively, or in addition, the dimensions of the vehicle may be determined by comparing a portion of the vehicle depicted in the image obtained by the user computing device with a reference within the image that is associated with known dimensions, such as a car battery of a particular type or brand. Advantageously, in certain embodiments, by generating a three-dimensional scene created from the three-dimensional models for the item and the vehicle, systems herein can determine or confirm whether an item will fit the vehicle. In some cases, it may be determined that an item will not fit a vehicle despite assertion by a manufacturer or distributer. In other cases, the user can determine whether an item fits a particular vehicle despite a lack of assertion that the item will fit the vehicle. This determination can be particularly advantageous for determining whether an existing item will fit a new vehicle or a new model of a vehicle.

Example Use Case

Figure 1B:
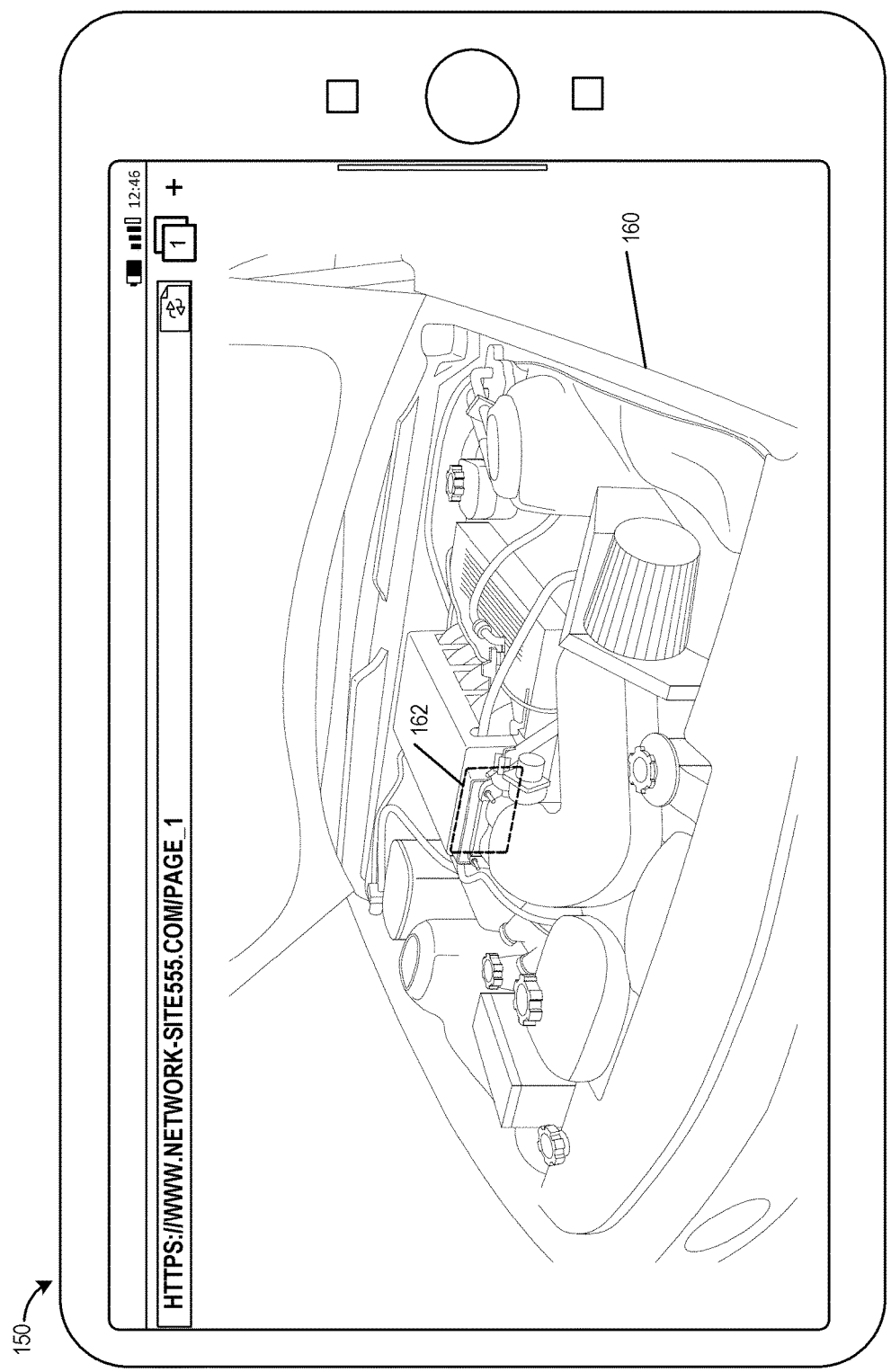
FIG. 1B is a pictorial diagram illustrating an example of a computing system displaying an annotated image identifying a vehicle connection point for the vehicle of FIG. 1A.

FIGS. 1A and 1B depict an example use case for identifying an access point of a vehicle. FIG. 1A is a pictorial diagram illustrating an example of a portion of a vehicle 100, including an engine compartment 102. The vehicle 100 can include any type of vehicle. In this particular example, the vehicle 100 is an automobile. A user seeking to upgrade or replace a component located in the engine compartment 102 of the vehicle 100 can use a user computing device to generate an augmented reality image of the vehicle's engine compartment 102 as described with respect to FIG. 1B.

FIG. 1B is a pictorial diagram illustrating an example of a computing system 150 displaying an annotated image 160 identifying a vehicle connection point 162 for the vehicle 100 of FIG. 1A. In this particular example, the vehicle connection point 162 is an access point or a connection point that may be used for attaching a supercharger to the engine of the vehicle 100. The vehicle connection point 162 may be presented to the user on the display of the computing system 150 while an optical system (e.g., a camera) captures an image of the vehicle 100.

As illustrated in FIG. 1B, the annotated image may be presented to the user via a network site. However, in other embodiments, the annotated image may be generated and/or presented to the user via an application, which may be hosted at least in part over a network or on the computing system 150. For example, the application may be locally stored at the computing system 150 and may be configured to communicate with a server or other computing system via a network. In some embodiments, one or more processes described herein may be performed entirely on the computing system 150.

In this particular example, the vehicle connection point 162 is identified by annotating an original image with a dashed box surrounding the vehicle connection point 162. However, other types of annotation are possible. For example, the annotation may be a shaded box. In some cases, the annotation generally encircles or otherwise identifies the location of the vehicle connection point 162. This annotation may not be precise, but may generally identify the location of the vehicle connection point 162. In other implementations, the annotation may be configured with the precise dimensions or the determined dimensions of the vehicle connection point 162. In some embodiments, modifying the image to draw a viewer's attention to the determined vehicle connection point may include altering the color, brightness, contrast, hue, or other display information for the portions of the captured image that correspond to the vehicle connection point (such as specific pixels that collectively make up the visible portions of the vehicle connection point in the image). Additionally or alternatively, the portions of the image other than the vehicle connection point may be modified to be lighter, darker, lower contrast, less saturated, in grayscale, and/or otherwise modified to draw less attention by a viewer. The vehicle connection point in the annotated image may then, for example, appear visually highlighted relative to the remainder of the image without necessarily adding a box, circle, arrow or other discrete annotation object.

Figure 2A:
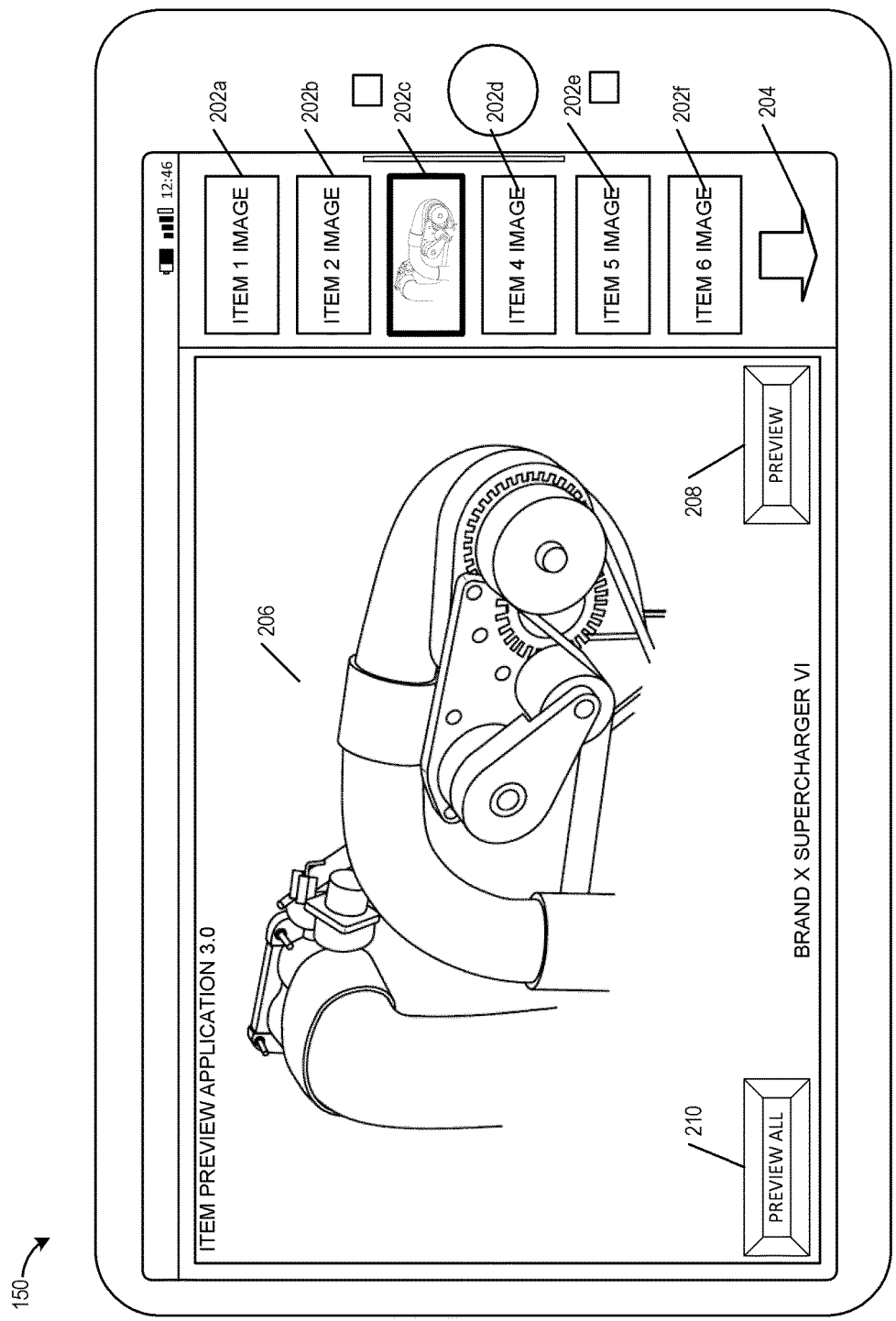
FIG. 2A is pictorial diagram of an illustrative user interface generated by a computing system for selecting a vehicle component to preview.

FIG. 2A is pictorial diagram of an illustrative user interface generated by a computing system 150 for selecting a vehicle component to preview. As illustrated in FIG. 2A, a user may browse or search for a number of vehicle components, which may be presented as a set of item images 202a-f. The user may select a particular item to preview by selecting one of the item images 202a-f. For example, in FIG. 2A the user has selected item image 202c. The user may view more items by using the arrow button 204. In this particular case the item has selected a particular supercharger to view and a larger image 206 of the supercharger is presented to the user.

In some cases, the items available for selection by the user may be based on the vehicle connection point 162. Further, a user may elect to preview the selected item by selecting or otherwise interacting with the preview button 208. In some embodiments, a user may select multiple items to preview, either together or with respect to a vehicle. In such cases, the user may interact with the preview all button 210 to indicate that the user desires to preview multiple selected items. Further, the items may be previewed in a manner to depict how the multiple items may be connected together or used in conjunction with each other.

Figure 2B:
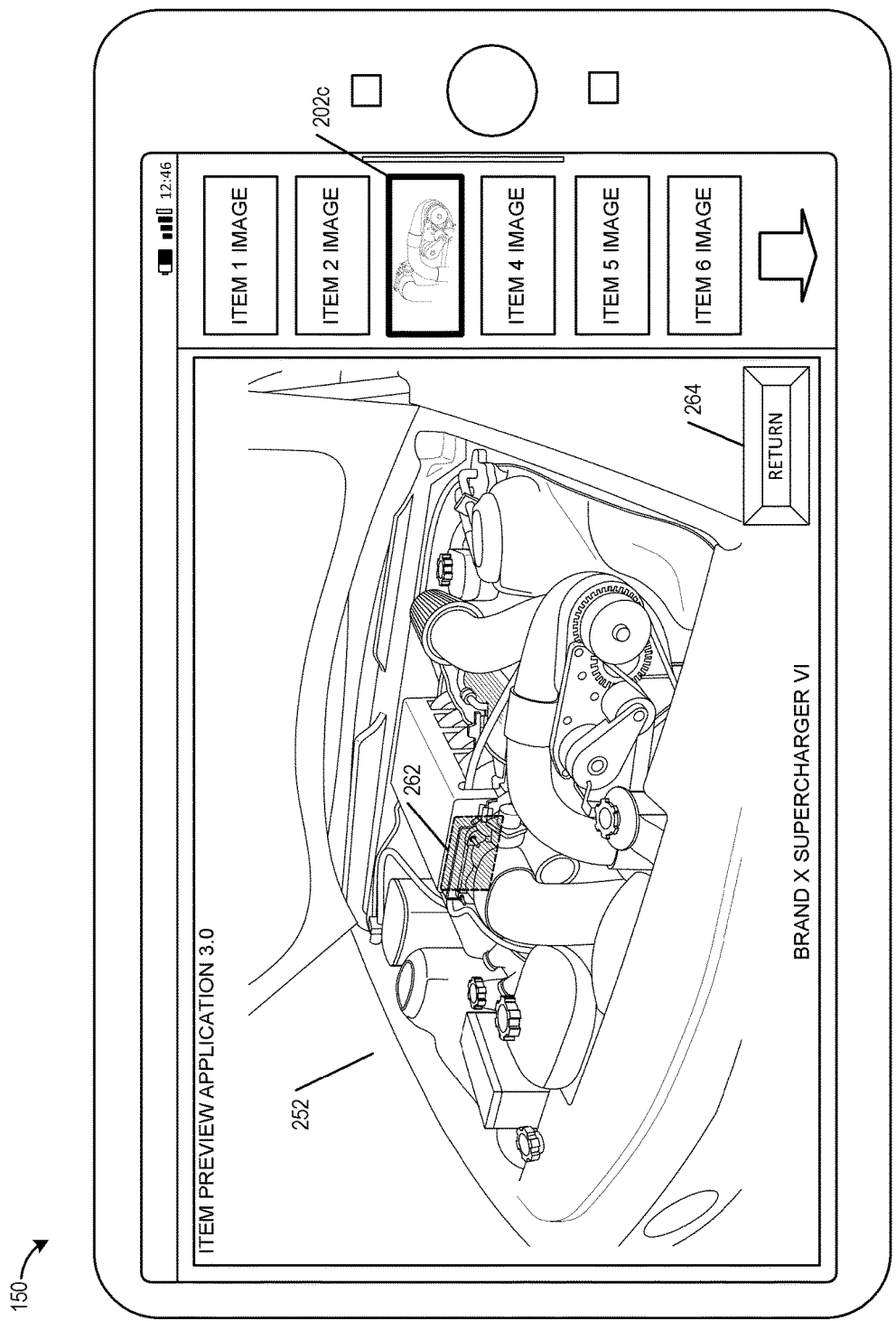
FIG. 2B is pictorial diagram of the illustrative user interface of FIG. 2A displaying a preview image demonstrating the installation of the vehicle component with respect to a vehicle.

FIG. 2B is pictorial diagram of the illustrative user interface of FIG. 2A displaying a preview image 252 demonstrating the installation of the selected vehicle component 202c with respect to the vehicle 100 illustrated in FIG. 1A. In this particular example, the portion of the image depicting the vehicle connection point 162 has been modified as illustrated by the vehicle connection point 262 to illustrate that an aftermarket part, or a part not currently installed in the engine compartment 102, is displayed as being connected to the vehicle connection point 262 in the preview image 252. In other embodiments, the annotation of the vehicle connection point 262 may match the annotation of the vehicle connection point 162. In other cases, the annotation of the vehicle connection point 262 may not be displayed.

The presentation of the preview image 252 may be static or may be a form of augmented reality. In other words, in some cases, the preview image 252 is presented to the user while the computing device 150 continues to capture images of the vehicle 100 without the selected vehicle component 202c corresponding to the supercharger. In some cases, the user may return to the image of the selected item by interacting with the return button 264.

Example Networked Computing Environment

FIG. 3 illustrates an embodiment of a networked computing environment 300 that can implement the features described herein. The networked computing environment 300 may include a number of user computing devices 302 that can communicate with an interactive computing system 310 via a network 304. The interactive computing system 310 can generally include any system that can create an image-based or graphical preview of the use and/or installation of an item with respect to another item. However, as stated above, to simplify discussion and not to limit the disclosure, this application will primarily describe previewing in an image the installation of a vehicle component in a vehicle. Nevertheless, it should be understood that the interactive computing system 310 may be used to identify and/or preview other types of complementary items. For instance, presented with an image of a television, compatible DVD players may be presented to a user. The presentation may include an image that illustrates the installation of a DVD player with the television enabling an aesthetic-sensitive user to preview the look of a particular DVD player with the user's television. As a second example, presented with an image of a shirt, matching skirts or pants may be presented to a user. The presentation may include an image that illustrates the upper body apparel and the lower body apparel on a manikin or model of the user enabling the user to preview the outfit designed by the user.

In some cases, the interactive computing system 310 may host a network application for identifying complementary items (e.g., vehicle components or items) to be used with items (e.g., vehicles) depicted in an image. The interactive computing system 310 may be associated with a network or Internet-based store or retailer. In some cases, the interactive computing system 310 may be associated with an Internet-based store that is affiliated with a brick-and-mortar store or retailer.

The interactive computing system 310 can include a number of systems that facilitate implementing the processes described herein. In the depicted embodiment, the interactive computing system 310 includes several components that can be implemented in hardware and/or software. For instance, the interactive computing system 310 can include one or more servers 320, which may be implemented in hardware, for receiving and responding to network requests from user computing devices 302. However, some of the capabilities of the servers 320 may be implemented in software. The one or more servers 320 can include web servers, application servers, database servers, combinations of the same, or the like.

Further, the interactive computing system 310 may include a catalog service 330, which may provide an electronic catalog of items. Information about items included in the electronic catalog may be stored and accessed from an item data repository 346. Users can browse or search the electronic catalog provided by the catalog service 330 by accessing the servers 320 and/or querying a search engine (not shown) hosted by the interactive computing system 310.

The electronic catalog content can include information about items. In one embodiment, this content is arranged in a hierarchical structure, having items associated with one or more categories or browse nodes in a hierarchy. The catalog service 330 can provide functionality for users to browse the item hierarchy in addition to searching the catalog via a search engine.

In some cases, the hierarchical structure can include a tree-like structure with browse nodes that are internal nodes and with browse nodes that are leaf nodes. The internal nodes generally include children or descendent nodes and the leaf nodes generally do not include children nodes. The internal nodes may be associated with an item category or classification, which can include sub-classifications. The sub-classifications may represent additional internal nodes or leaf nodes. The leaf nodes may be associated with an item category or classification that does not include sub-classifications. In some implementations, the internal nodes are associated with item classifications and sub-classifications, but not items, and the leaf nodes are associated with the items. In other implementations, both the internal and leaf nodes may be associated with items.

Users can select an item represented in the hierarchy or in a list of search results to see more details about the item. In response to a user's item selection, the server 320 can provide to a user computing device 302 a catalog page (sometimes called an item detail page) that includes details about the selected item.

The interactive computing system 310 also includes a recommendation engine 352. The recommendation engine 352 can generally include any system for recommending one or more items or services to a user associated with a user computing device 302. The recommendation engine 352 may recommend an item in response to a request from a user or from an administrator associated with the interactive computing system 310. In one embodiment, the recommendation engine 352 may recommend an item automatically without receiving a user request. In some cases, the recommendation engine 352 may recommend an item to a user in response to a passage of time since a previous purchase by the user.

In some embodiments, a user may request a recommendation of one or more items by providing access to an image of one or more other items. The recommendation engine 352 may identify items to recommend based on the items illustrated in the image. In certain implementations, the recommendation engine 352 may recommend an alternative item in response to determining that a selected item does not fit or cannot function within a threshold degree of tolerance when used in conjunction with or when installed with respect to another item. In other words, as an example, the recommendation engine 352 may recommend alternative rims for a vehicle in response to determining that a selected set of rims do not fit the vehicle. In some cases, the threshold degree of tolerance may vary based at least in part on the type of items and/or the material properties for each of the items. For example, some materials may be capable of handling more stress and/or higher temperatures than other materials, which may be used to create a part of the same or similar type. Thus, the threshold degree of tolerance may be adjusted based on whether a particular part is metal, plastic, carbon fiber, or some other material. Further, in some cases, the recommendation engine 352 can recommend an alternative part or item that uses a material with higher tolerances that a part or item selected by the user.

In some cases, the recommended items are complementary items to the items illustrated or depicted in the image. The complementary items may include items that are of a different type than the items illustrated in the image, but that can be used in conjunction with the items of the image. For instance, the complementary items may be organizer items that can be used to organize and/or store the items illustrated in the image. As further non-limiting examples, the complementary items may be batteries, protective cases, or add-ons (e.g., expansions to board games or downloadable content for video games) that can be used with the items illustrated in the image. In other cases, the recommended items are items of a related type. For instance, if the image illustrates books or movies, the recommended items may be other books or movies that may be related to the illustrated books or movies (e.g., sequels, of the same genre, or with an actor, director, or author in common). As another example, if the image illustrates brake calipers on a vehicle, the recommended items may be other brake calipers.

According to some embodiments, the image may be any type of image that can be obtained by an optical device. For instance, the image may be a photograph or a frame of a video. The optical device may be a camera or other device capable of capturing an image. Further, the optical device may be a separate user device or may be a component of a user computing device 302. The recommendation engine 352 may analyze a copy of the image received at the interactive computing system 310 to develop its recommendations, or may use one or more additional systems (described below) hosted by the interactive computing system 310 to facilitate analyzing the image and developing the recommendations.

The interactive computing system 310 further includes an image acquisition system 322. The image acquisition system may include any system capable of receiving an image from a user computing device 302 and/or accessing an image from a data repository 340. The received image may be an image file, such as a JPEG, GIF, or bitmap file. In some cases, the received image is a frame from a streaming video or from a video file. Although illustrated as a separate component, in some cases, the image acquisition system 322 may be included as part of the servers 320.

As previously described, the recommendation engine 352 may recommend items based on items illustrated in an image or a portion of an item (e.g., a portion of a vehicle) illustrated in the image. To facilitate analyzing the image received by the image acquisition system 322, the interactive computing system 310 may include a spatial determination engine 354 and an item identification module 360.

Further, to facilitate analyzing the image, the image may include an illustration of a reference marker. A reference marker may itself be an image or an image of an object. For example, the reference marker may include the printout or an image of a printout of a tracer image. This tracer image may include an image previously provided to the interactive computing system 310 to serve as a reference for analyzing images. For example, the tracer image may be a machine-readable code, such as a barcode or a two-dimensional code, such as a Quick Response Code ("QR code"). Alternatively, or in addition, the tracer image may be a unique image generated for the purpose of serving as the tracer image. For example, the tracer image may be a stylized drawing of a dragon or some other creature. Alternatively, or in addition, the reference marker may be an image of a reference object.

The reference object may include any object whose dimensions or spatial characteristics are provided to the interactive computing system 310. For example, the reference object may be an image of a user computing device or a block of wood with known dimensions. In the context of vehicles, the reference object could be, for example, a standard or aftermarket component or part of a vehicle for which the user provides an indication of size to the computing system, such as wheels or tires of a known diameter. In some cases, the reference marker is provided to the interactive computing system 310. Alternatively, or in addition, characteristics of the reference marker, such as the dimensions of lines, shapes, and angles included in the reference marker, are provided to the interactive computing system 310.

In some implementations, an item and/or its spatial characteristics may be determined without a reference marker or object. Instead, in some cases, an identifiable portion of an item may be used to determine the size of the item and the item's spatial characteristics. For example, assuming the item is a car, a car battery, headlight, brand emblem, or other recognizable feature of the car may be used as a reference to determine the proportion of the car in the image. In some cases, a vehicle connection point may be of a known size and may be used as a reference for determining spatial characteristics of the vehicle and/or an item. In other cases, the make, model, and/or year of a vehicle may be determined based at least in part on a reference depicted in the image (e.g., a vin number or manufacturer sticker), and the size of the vehicle may be determined based on specification information available for the vehicle, which may be accessed based on the reference information (e.g., vin number).

The spatial determination engine 354 may include a system capable of determining one or more dimensions of a physical area illustrated in a received image. For example, the spatial determination engine 354 may be used to determine the size of an engine compartment of a car trunk. The dimensions may be determined by comparing the depiction of the physical area included in the image with the depiction of a reference marker or an identifiable feature of the car that serves as a reference. Further, one or more computer vision techniques and color identification techniques may be implemented to facilitate determination of the boundaries of the physical area. In some cases, the spatial determination engine 354 may be used to determine the size of items depicted in an image. For instance, the spatial determination engine 354 may compare an object to the reference marker or reference object to determine proportions of an item depicted in an image. For instance, a car battery with known proportions may be compared to an engine block to determine the size of the engine and the size of physical features of the engine.

The item identification module 360 may include a system capable of identifying items illustrated in a received image. In some embodiments, the item identification module 360 can identify the types of items included in the received image, the number of items included in the received image, and the dimensions of items included in the received image. In some cases, the item identification module 360 identifies the items in the received image and the dimensions of the items identified by comparing the depiction of the items with images of the item in an electronic catalog provided by the catalog service 330. Alternatively, or in addition, dimensions for the depicted items may be determined by comparing the depiction of the items included in the image with the depiction of the reference marker included in the image. Further, one or more computer vision techniques and/or color identification techniques may be implemented to facilitate identifying items in the image or in distinguishing between multiple items in the image.

As previously described, augmented reality techniques can be used to present a modified version of a received image to a user. This modified version of the received image may illustrate how the recommended item can be used with items illustrated in the received image. In some cases, because the modified version of the received image previews how the recommended item may be used in a particular context, the modified version of the received image may be referred to as a "preview image." To facilitate generation of the modified version of the received image, the interactive computing system 310 includes an image generator 358. Further, in some cases, image generator 358 may use an image splicer 356 and/or a 2D to 3D converter 362 to facilitate generation of the preview image.

Image generator 358 may include a system capable of generating a two dimensional (2D) image and/or a three dimensional (3D) image based on a received image and one or more models of items. The models of the items may include electronic models or images of the items. In some cases, the models are templates of items. These templates may be wireframes or partially formed models of an item, which can be used to create models of items using information obtained, for example, from the received image. For instance, size, color, and texture information may be obtained from the received image and used in conjunction with the template of an item to create a 3D model of the item. Moreover, unique features of an item may be obtained from the image and applied to create the 3D model for the item. For example, scratches, dings, or custom paint colors may be identified from the image and applied to the 3D model enabling a preview image that matches a user's specific instance of an item.

The models of the items may include models for items identified from the received image and models for items identified in response to a search request and/or for recommendation by the recommendation engine 352. In some cases, the image generator 358 creates a new image based on the received image and the one or more models of items. In other cases, the image generator 358 may modify the received image by replacing portions of the received image or overlaying one or more models of items over portions of the received image.

Although in some cases one or more models of the items may be 2D images, typically the one or more models are 3D images or models. The image generator 358 may position models for the items depicted in the received image with respect to a model for an item determined by the recommendation engine 352 to create a composite image. For example, if the item depicted in the received image is a wheel of a motorcycle and the recommended item is a brake caliper, the image generator 358 may position a 3D model for the recommended brake caliper with respect to a 3D model for the wheel of the motorcycle so that the brake caliper is illustrated as being placed in a designate location around the wheel.

In some cases, the composite image is provided to the user computing devices 302 as a 3D image. Advantageously, in certain embodiments, providing the image as a 3D image enables a user to view the image with a user computing device 302 that has the capability to output or display a 3D image. Further, in certain embodiments, a user may alter the view of the 3D image to see a different perspective of the image. In other cases, the image generator 358 converts the 3D image into a 2D image (or renders a 3D scene to a 2D image) before providing the composite image to the user computing device 302.

The image splicer 356 may include a system capable of dividing an image into multiple portions. In some cases, the image generator 358 may use the image splicer 356 to remove portions of a received image that includes items and to replace the removed portions with the 3D models of the items identified by the image generator 358 or the item identification module 360. In some embodiments, the image splicer 356 may be omitted or optional because, for example, the image generator 358 creates an image by overlaying image models on top of the received image or by creating a new image.

The 2D to 3D converter 362 may include a system capable of transforming a 2D image into a 3D image. To convert an image from a 2D image to a 3D image, the 2D to 3D converter 362 may apply one or more transformations to a portion of an image that includes a depiction of an item. In some cases, the 2D to 3D converter 362 may convert a 2D image of an item to a 3D image by extruding the 2D image. In some embodiments, the 2D to 3D converter 360 may determine how much to extrude and/or what other transformations to apply to a 2D image based on a comparison between the 2D image and a portion of the received image that includes the reference marker, such as by determining a perspective angle of the scene captured in the image based on skew and other characteristics identified from the reference marker depicted in the image.

The data repository system 340 can generally include any repository, database, or information storage system that can store information associated with items and users. This information can include any type of data, such as item descriptions, account information, customer reviews, item tags, or the like. Further, this information can include relationships between items, between users, and/or between items and users.

The data repository 340 can include a user data repository 342, an item models repository 344, and an item data repository 346. The user data repository 342 can store any information associated with a user including account information, user purchase information, user demographic data, item view information, user searches, identity of items owned by a user (e.g., purchased or obtained as a gift) or the like.

The item data repository 346 can store any information associated with an item. For example, the item data repository 346 can store item descriptions, customer reviews, item tags, manufacturer comments, service offerings, etc. In some embodiments, item data stored for at least some of the items identified in the item data repository 346 may include, but is not limited to, price, availability, title, item identifier, item feedback (e.g., user reviews, ratings, etc.), item image, item description, item attributes (such as physical dimensions, weight, available colors or sizes, materials, etc.), keywords associated with the item, and/or any other information that may be useful for presentation to a potential purchaser of the item, for identifying items similar to each other, and/or for recommending items to a user.

One or more of the user data repository 342 and the item data repository 346 can store any information that relates one item to another item or an item to a user. For example, the item data repository 346 can include information identifying items that were first available in a specific year, items that share an item classification, or items that share a sales ranking (e.g., items on top ten sales list by volume and/or by monetary sales numbers).

The item models repository 344 may store images and/or 3D models representative of items included in an electronic catalog provided by the catalog service 330. The images may be 2D images or 3D images. Further, the images may serve as templates that can be used by the image generator 358 to create models of items and/or a composite image that can include multiple items and/or which may be joined or otherwise merged with an image provided by a user computing device 302.

The various components of the interactive computing system 310 may be implemented in hardware, software, or combination of hardware and software. In some cases, some components may be implemented in hardware while other components of the interactive computing system 310 may be implemented in software or a combination of hardware and software. For example, in one embodiment, the image acquisition system 322 and the recommendation engine 352 may be implemented in hardware, while the image generator 358 and the image splicer 356 may be implemented in software. Further, the data repositories 340 may be implemented in the storage systems of the servers 320 or may be implemented in separate storage systems.

The user computing devices 302 can include a wide variety of computing devices including personal computing devices, tablet computing devices, electronic reader devices, mobile devices (e.g., mobile phones, media players, handheld gaming devices, etc.), wearable devices with network access and program execution capabilities (e.g., "smart watches" or "smart eyewear"), wireless devices, set-top boxes, gaming consoles, entertainment systems, televisions with network access and program execution capabilities (e.g., "smart TVs"), kiosks, speaker systems, and various other electronic devices and appliances. Further, the user computing devices 302 can include any type of software (such as a browser) that can facilitate communication with the interactive computing system 310. In some cases, a user may access the interactive computing system 310 via a network page hosted by the interactive computing system 310 or by another system. In other cases, the user may access the interactive computing system 310 via an application.

The network 304 may be a publicly accessible network of linked networks, possibly operated by various distinct parties. Further, in some cases, the network 304 may include the Internet. In other embodiments, the network 304 may include a private network, personal area network, local area network, wide area network, cable network, satellite network, cellular telephone network, etc., or combination thereof, each with access to and/or from an external network, such as the Internet.

The architecture of the interactive computing system 310 may include an arrangement of computer hardware and software components as previously described that may be used to implement aspects of the present disclosure. The interactive computing system 310 may include many more (or fewer) elements than those illustrated. It is not necessary, however, that all of these elements be shown in order to provide an enabling disclosure. Further, the interactive computing system 310 may include a processing unit, a network interface, a computer readable medium drive, an input/output device interface, a display, and an input device, all of which may communicate with one another by way of a communication bus. The network interface may provide connectivity to one or more networks or computing systems. The processing unit may thus receive information and instructions from other computing systems or services via the network 304. The processing unit may also communicate to and from memory and further provide output information for an optional display via the input/output device interface. The input/output device interface may also accept input from the optional input device, such as a keyboard, mouse, digital pen, microphone, touch screen, gesture recognition system, voice recognition system, image recognition through an imaging device (which may capture eye, hand, head, body tracking data and/or placement), gamepad, accelerometer, gyroscope, or other input device known in the art.

The memory may contain computer program instructions (grouped as modules or components in some embodiments) that the processing unit executes in order to implement one or more embodiments. The memory may generally include RAM, ROM and/or other persistent, auxiliary or non-transitory computer-readable media. The memory may store an operating system that provides computer program instructions for use by the processing unit in the general administration and operation of the interaction service. The memory may further include computer program instructions and other information for implementing aspects of the present disclosure. For example, in one embodiment, the memory includes a user interface module that generates user interfaces (and/or instructions therefor) for display upon a computing device, e.g., via a navigation interface such as a browser or application installed on the computing device. In addition, memory may include or communicate with an image data repository, a dimension data repository, and/or one or more other data stores.

Further, although certain examples are illustrated herein in the context of an interactive computing system 310 that communicates with a separate user computing device 302, this is not a limitation on the systems and methods described herein. It will also be appreciated that, in some embodiments, a user computing device 302 may implement functionality that is otherwise described herein as being implemented by the elements and/or systems of the interactive computing system 310. For example, the user computing devices 302 may generate composite images or annotated images based on images of items and an image of a recommended or selected complementary item without communicating with a separate network-based system, according to some embodiments.

Example Item Preview Process

Figure 4:
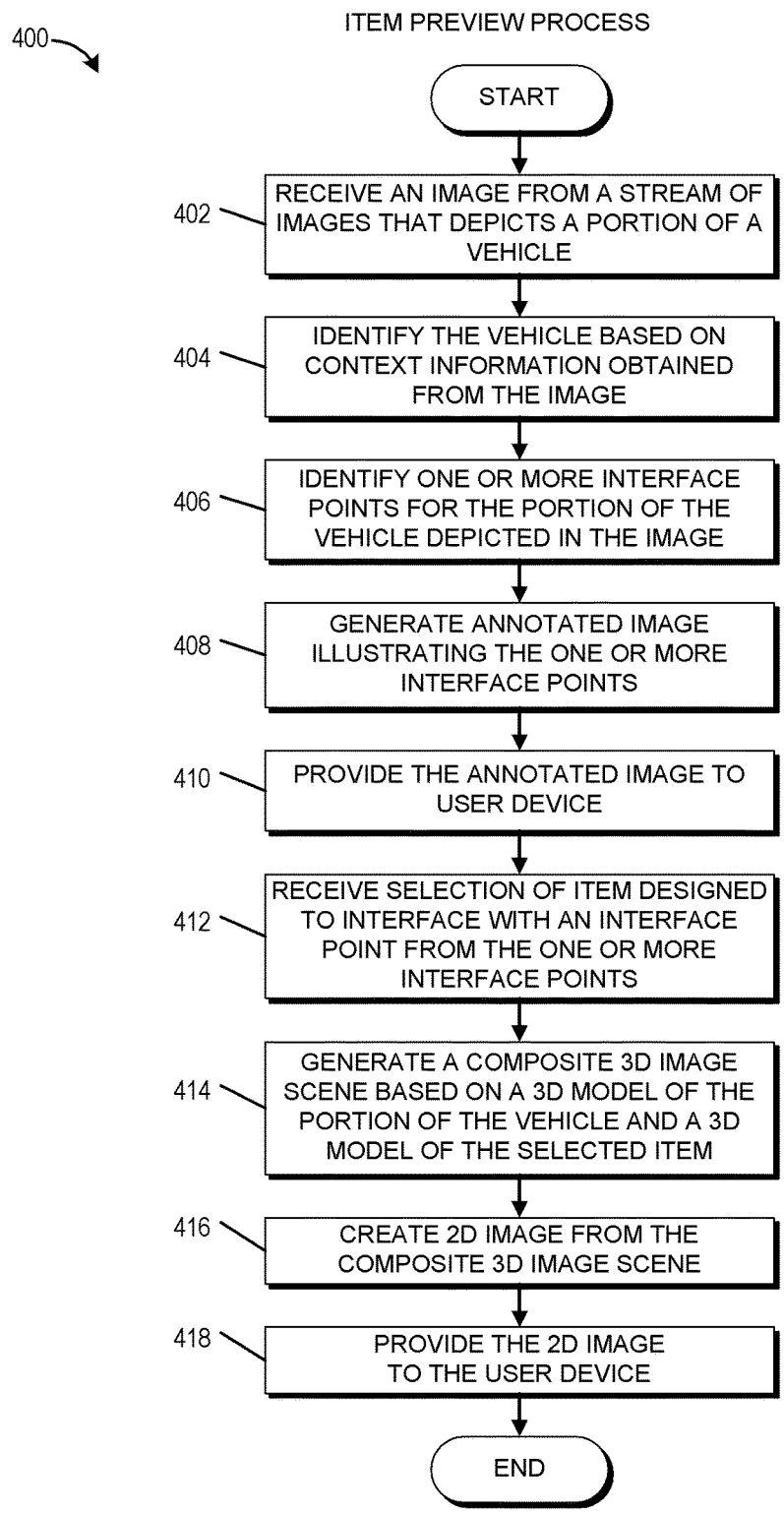
FIG. 4 is a flowchart of an illustrative embodiment of an item preview process that may be implemented by an interactive computing system.

FIG. 4 is a flowchart of an illustrative embodiment of an item preview process 400 that may be implemented by an interactive computing system 310. The process 400 can be implemented by any system that can create a preview image of an item to be used or installed in conjunction with another item. For example the process 400, in whole or in part, can be implemented by an interactive computing system 310, an image acquisition system 322, a recommendation engine 352, a spatial determination engine 354, an image splicer 356, an image generator 358, an item identification module 360, and/or a 2D to 3D converter 362, to name a few. Although any number of systems, in whole or in part, can implement the process 400, to simplify the discussion, portions of the process 400 will be described with reference to particular systems.

Further, although the process 400 may generally be used to preview any number of items used or installed in conjunction with each other, to simplify discussion, the process 400 will be described with respect to an item or vehicle component used or installed in conjunction with a vehicle. Moreover, in some cases, the process 400 may be used to preview multiple items or vehicle components with a vehicle. In some cases, the process 400 may be used in conjunction with the process 500 described in more detail with respect to FIG. 5 below.

The process 400 begins at block 402 where, for example, the image acquisition system 322 receives an image from a stream of images that depicts a portion of a vehicle. In some cases, the image is a frame from a video. In other cases, the image is a single picture not associated with a stream of images. Often times, the portion of the vehicle depicted in the image includes a portion of the vehicle where a user is considering installing, replacing or otherwise adding a vehicle component. For example, if the user is considering purchasing new brake calipers, a portion of the vehicle depicted in the image may include one or more wheels of the vehicle. In some cases, the image may depict the entire vehicle. The type of vehicle depicted is not limited by the present disclosure. For example, the vehicle may be an automobile, a boat, an airplane, a bicycle, a skateboard, etc.

The item identification module 360, at block 404, identifies the vehicle based on context information obtained from the image. Generally, the context information includes recognizable portions of the vehicle. For example, in some cases, a vehicle may be identified based on the shape of its body, the shape of a feature of the vehicle (e.g., a headlight or brake light), a shape of the engine within the engine compartment, a type of battery, a size of the vehicle, a combination of features of the vehicle, and the like. Further, in some cases, the context information may include alphanumeric text, such as a vehicle identification number (VIN) for the vehicle or a brand or model label attached to the vehicle (e.g., on the trunk). Moreover, in some cases, the vehicle may be identified by a unique badge or emblem associated with the vehicle. Identifying the vehicle may include identifying the brand of the vehicle, a model of the vehicle, the year of the vehicle, and any other information that may be used to identify a specification for the vehicle. This identification information may be determined, for example, from user input, based on a database indexed by, for example, VIN' numbers, or manufacturer specification information, and the like. In some cases, the dimensions of the vehicle may be determined by using a portion of the image that depicts a component whose dimensions are known by, or have previously been provided to, the interactive computing system 310 as a reference. In some embodiments, one or more images from the stream of images may be used to identify the vehicle, while other images may be used to complete the remainder of the process 400. For example, one image may include the VIN and may be used to identify the vehicle, while other images may be used to identify interface points for the vehicle and to preview items used in conjunction with the vehicle.

At block 406, the item identification module 360 identifies one or more interface points for the portion of the vehicle depicted in the image. The interface points may be identified based at least in part on the identification of the vehicle determined at the block 404. In some cases, at least one interface point may be located between at least two components of the vehicle. In some embodiments, the item identification module 360 determines the portion of the vehicle depicted in the image. Further, the item identification module 360 may identify where different vehicle components are located in the image based at least in part on vehicle layout information for the vehicle, which may be stored in the data repository 340. Alternatively, or in addition, the item identification module 360 may use image comparison techniques to determine the location of the vehicle components. Using information about the vehicle components and the vehicle, it is possible to identify the one or more interface points where vehicle components may be added or substituted. In some embodiments, a 3D model of the vehicle is accessed from, for example, the data repository 340. Using a combination of the 3D model of the vehicle and the portion of the vehicle depicted in the image, the interface points may be identified in the image.

The image generator 358, at block 408, generates an annotated image that illustrates the one or more interface points identified at the block 406. In some cases, a filter may be applied to the identified one or more interface points before and/or after generating the annotated image. For example, a user may identify particular interface points of interest, and other access points from the one or more interface points may be filtered before the annotated image is created. Alternatively, the one or more interface points may be filtered after the annotated image is created in the new annotated image may be created or displayed without the interface points that have been filtered from the one or more interface points. In some cases, the interface points may be automatically filtered based on one or more items that have been selected or otherwise accessed by the user. For example, the interface points may be filtered to only show interface points that are identified in a data store as being compatible with or otherwise associated with an item category of an item selected by the user.

Generating the annotated image may include converting at least a portion of the received image from a two-dimensional form to a three-dimensional form. The conversion may include extruding elements illustrated in the image from two dimensions to three dimensions. Alternatively, the conversion may occur by generating a three-dimensional image using a combination of the two-dimensional image and a specification for the vehicle identified at the block 404. In some such cases, the specification may include physical specifications, such as size and shape information, for the vehicle.

Alternatively, or in addition, generating the annotated image may include accessing one or more three-dimensional models in converting the models to a two-dimensional image. The interface points may be added or annotated into the three dimensional image before conversion to the two-dimensional image or may be annotated on the two-dimensional image after its creation. In some embodiments, a combination of methods may be used to generate the annotated image. For example, if the vehicle depicted in the image received at the block 402 includes aftermarket parts, a combination of using 3D models and extruding portions of the received image may be used to generate the annotated image. In some embodiments, one or more previously stored 3D models of components, a whole vehicle, or portions of a vehicle may be retrieved from a data store and the corresponding 2D image data of the component(s) or portions of the vehicle captured in the user's image may be applied to the retrieved 3D model(s) as a texture and rendered to a 3D image.

At block 410, the interactive computing system 310 provides the annotated image generated at the block 408 to a user computing device 302. The user computing device 302 may then present the annotated image to the user. In some cases, as the user computing device 302 is moved in relation to the vehicle, the annotated image generated at the block 408 may be updated or a new annotated image may be created to reflect the movement of the user computing device 302 with respect to the vehicle. Thus, in some cases, the image displayed to the user on the user computing device 302 may present the same view to the user as is captured by an image capturing device (e.g., a camera) of the user computing device 302.

In some embodiments, one or more of the blocks 408 and 410 may be optional or omitted. For example, in cases where a user has identified an item or vehicle component, or has previously identified an interface point for the vehicle, the blocks 408 and 410 may be omitted.

At block 412, the interactive computing system 310 receives a selection of an item designed to interface, or connect, with an interface point from the one or more interface points identified at the block 406. In some cases, the block 412 may include receiving a selection of an interface point from the one or more interface points. Alternatively, or in addition, the block 412 may include automatically determining an interface point based on the selected item. For example, if the image depicts a portion of the vehicle that includes an interface point for a brake caliper and an interface point for a wing or spoiler, in the selected item is a spoiler, the interface point associated with the spoiler may automatically be selected. In some cases, multiple interface points may automatically be selected. For example, if the selected item is a brake caliper and the image depicts multiple wheels, multiple interface points may be selected corresponding to each of the depicted wheels. In some implementations, when multiple interface points may be used for a selected item, one of the interface points may automatically be selected. Alternatively, or in addition, the multiple interface points may be presented to a user enabling the user to select one or more of the interface points.

In some embodiments, one or more items may be presented to a user based on the selection of an interface point. For example, if a hubcap interface point is selected, one or more hubcaps may be presented to the user. Further, in some cases, the recommendation engine 352 may recommend one or more hubcaps based at least in part on the vehicle identified at the block 404, user-specific preferences, user-to-user similarities, inventory, sales rank, or any other recommendation factor. In some embodiments, the one or more interface points of the block 406 are identified based at least in part on a selected vehicle component or item.

In some cases, although an item is designed to interface with or identified as being capable of interfacing with a particular interface point, the item may not be capable of interfacing with the interface point despite the design. For example, a manufacturer may state that a particular item may be used with car models X, Y, and Z. However, it is possible that a particular item does not fit car model Z due to a difference in the design between car models X and Y, and Z. In some such cases, the interactive computing system 310 may confirm whether the selected item fits or can interface with an interface point from the one or more interface points. This confirmation process may be performed as part of the block 414. In some embodiments, an annotated version of the image may indicate whether a selected item will fit or not fit one or more of the interface points. For example, an interface point may be outlined or shaded with green if a selected item will fit the interface point. Alternatively, if the selected item will not fit the interface point, the interface point may be outlined or shaded in red. In some cases, additional or alternative annotations may be used to convey information to the user. For example, if a selected item fits, but provides less than a threshold amount of clearance in the engine compartment, the interface point may be shaded yellow.

At block 414, the image generator 358 generates a composite three-dimensional image scene and/or three-dimensional image based on a three-dimensional model of the portion of the vehicle and a three-dimensional model of the selected item. In some cases, the three-dimensional scene is created to provide a model of the vehicle and a selected item. This model may then be rotated or interacted with as desired. A 3D image can then be rendered from the 3D scene as desired for presentation to a user on a display. The three-dimensional model of the selected item may be obtained by accessing the item models repository 344. Further, the three-dimensional model selected item may be generated based on specification information previously provided by a manufacturer or distributor the item. Alternatively, or in addition, the three-dimensional model for the selected item may have been generated by using one or more measurement tools and/or techniques for measuring an instance or copy of the item. For example, a laser measurement tool may be used to obtain measurements for a physical instance of the item. Based on the obtain measurements, an accurate digital model for the item may be generated.

Generating the composite three-dimensional scene may include positioning the three-dimensional model of the selected item with respect to an interface point represented in the three-dimensional model of the portion of the vehicle. In some cases, generating the composite three-dimensional scene may include scaling, translating, rotating, or otherwise transforming one or more of the models for the selected item and/or the vehicle, or portion of the vehicle. Further, in some cases, by determining whether the three-dimensional model of the selected item fits the interface point of the three-dimensional model of the portion of the vehicle within a degree of tolerance, it can be confirmed whether the selected item will fit the vehicle. Determining whether the 3D model of the selected item fits the interface point of the 3D model of the vehicle may include determining whether an interface point of the selected item will fit or mate with the interface point of the 3D model of the vehicle. Determining whether the item will fit the vehicle may include other considerations as well, such as whether there is sufficient space for the full item in the given location, whether there is sufficient clearance for the item to reach the given position during installation (such as in a case where the item must be installed under or by passing through other components), and/or other factors.

In some embodiments, creating the 3D scene includes removing a portion of the 3D model for the vehicle corresponding to a component of the vehicle. This removed component may be replaced by the selected item or made unnecessary by the selected item. Alternatively, the removed component may no longer be visible in the image because it is obscured or occluded by the selected item. To reduce processing time, the obscured component may be removed from the composite 3D image.

In some embodiments, the block 414 may include identifying a vehicle component of the vehicle depicted in the image that is an aftermarket component or a component that was not included in the vehicle by the vehicle manufacturer. If an aftermarket vehicle component is identified, the interactive computing system 310 may identify the vehicle component and access a three-dimensional model for the vehicle component from, for example, the items model repository 344. The model for the aftermarket vehicle component may be used to generate the composite 3D image of the portion of the vehicle and the 3D model of the selected item. In some embodiments, one or more of the interface points may be located on the aftermarket vehicle component.

At block 416, the image generator 358 creates a two-dimensional image from the composite three-dimensional scene generated at the block 414. At block 418, the interactive computing system 310 provides the two-dimensional image to a user computing device 302. This two-dimensional image may be presented to the user enabling the user to preview how a vehicle component may fit and/or look with the user's vehicle. In some cases, the user computing device 302 may present the two-dimensional image on a display to the user while the user computing device 302 is capturing images of the vehicle. Further, as previously described with respect to the annotated image, the two-dimensional image created from the composite three-dimensional scene may be modified to reflect the view of the vehicle captured at a particular point in time by the user computing device 302. In certain embodiments, the user computing device 302 may be provided with the three-dimensional scene and/or the three-dimensional image rendered or created from the three-dimensional scene. Advantageously, by providing the three-dimensional image to the user computing device 302, a user computing device with a three-dimensional display may present the three-dimensional image to the user.

In some cases, a selected item may not fit or be usable with a particular vehicle. In some cases, the recommendation engine 352 may present an alternative item that can be used with or does fit the particular vehicle.

In some embodiments, the item identification module 360 can identify a portion of a vehicle or a component of the vehicle despite the component not matching a 3D model for the component when new. In other words, in some cases, the identification module 360 can identify an item that has a degree of wear, such as worn brake pads or worn tires. Further, in some cases, by comparing the identified component of the vehicle with a model of the component when new. In some such embodiments, the interactive computing system 310 can alert the user if a component is worn down by a threshold degree or is in an unsafe condition. Further, the recommendation engine 352 can recommend the user replace the component. This recommendation may include an identity of one or more recommended replacement items or models for the component.

Example Multiple Item Preview Process

Figure 5:
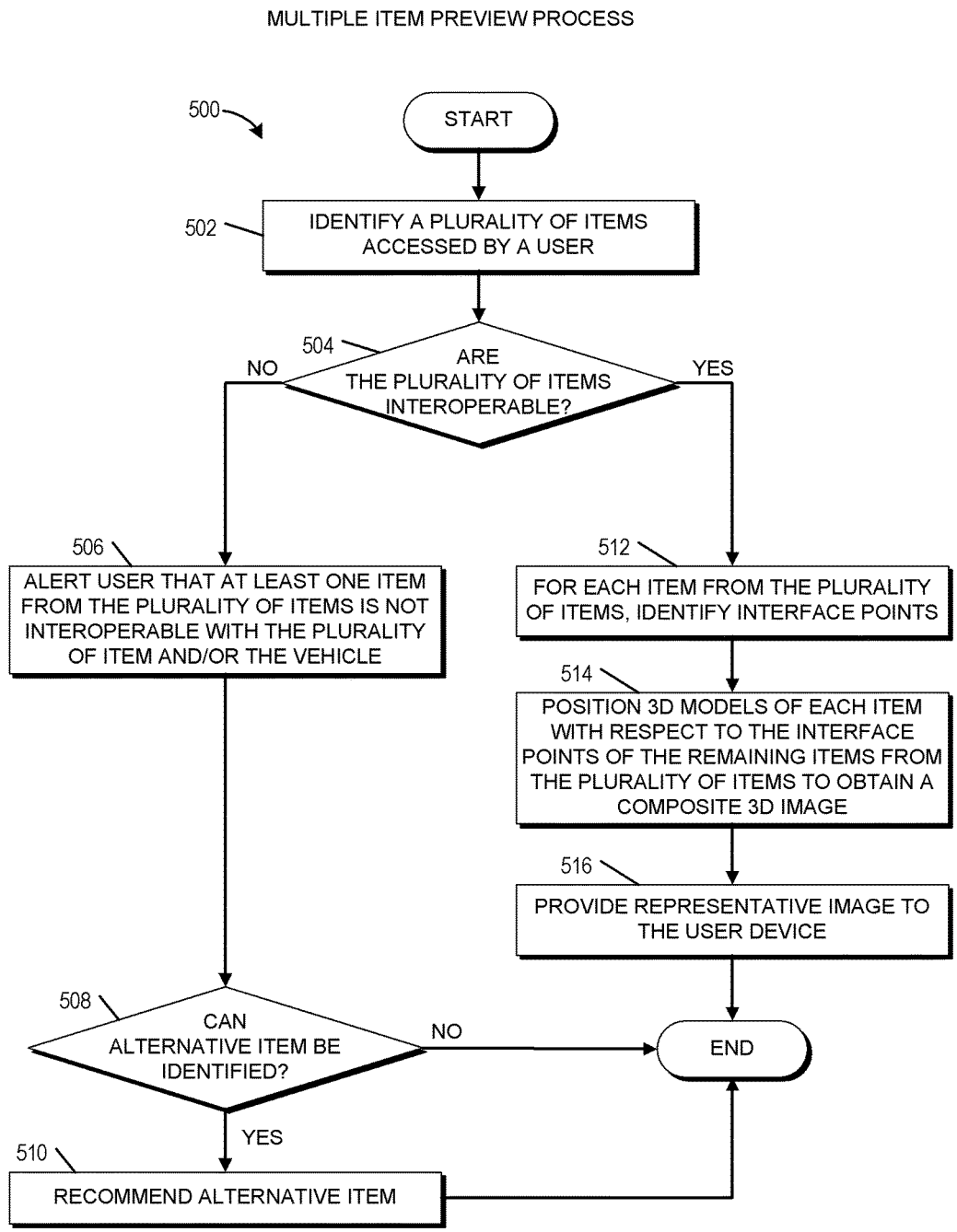
FIG. 5 is a flowchart of an illustrative embodiment of a multiple item preview process that may be implemented by an interactive computing system.

FIG. 5 is a flowchart of an illustrative embodiment of a multiple item preview process 500 that may be implemented by an interactive computing system 310. The process 500 can be implemented by any system that can create a preview image of multiple items (e.g., vehicle components) that may be used or installed in conjunction with each other, and in some cases, with another item, which may be considered a base item (e.g., a vehicle). For example the process 500, in whole or in part, can be implemented by an interactive computing system 310, an image acquisition system 322, a recommendation engine 352, a spatial determination engine 354, an image splicer 356, an image generator 358, an item identification module 360, and/or a 2D to 3D converter 362, to name a few. Although any number of systems, in whole or in part, can implement the process 500, to simplify the discussion, portions of the process 500 will be described with reference to particular systems.

In some embodiments, the process 500 may include performing at least some of the process 400. For example, the process 500 may begin by performing one or more operations associated with the blocks 402-410. In some embodiments, the process 500 may be performed as part of the block 412.

The process 500 begins at block 502 where, for example, the interactive computing system 310 identifies a plurality of items accessed by a user. In some cases, the plurality of items may be a subset of items accessed by the user. Further, the plurality of items may include items placed in a shopping cart or identified by a user for inclusion in a preview image generation process.

At decision block 504, the interactive computing system 310 determines whether the items of the plurality of items are interoperable. Determining whether the plurality of items are interoperable may include determining whether to or more of the plurality of items may be physically connected and/or may function together within design tolerances. In some cases, determining whether two items may function together includes determining whether one of the items may be directly connected to the other item. However, in some embodiments, determining whether two items are interoperable may include determining whether each of the two items may function within design tolerances when both items are installed or used with respect to a third item (e.g., a vehicle) whether or not the two items are directly connected or in direct communication with each other. In some cases, the plurality of items joined or used together may be compared to an identified vehicle to determine whether the plurality of items will fit or function with the particular vehicle. In some cases, multiple items are joined to different interface points of the vehicle. Alternatively, or in addition, a first item may be joined to an interface point of the vehicle, and another item may be joined to an interface point of the first item. Dimensions for the multiple items may be used to determine that the items may be used together in the vehicle and fit within or on the vehicle without impeding the operating of a portion of the vehicle.

In some embodiments, the decision block 504 may include determining whether the items of the plurality of items are interoperable for a particular vehicle identified, for example, as part of the block 404. In some cases, identifying whether one or more items in the plurality of items are operable with a particular vehicle, as well as with each other, may include determining whether a particular vehicle include aftermarket parts and whether the items of the plurality of items can function with the aftermarket parts.

Determining whether items of the plurality of items are interoperable, either with each other or with a particular vehicle, may be based on the functionality of one or more of the items, design or manufacture specifications for one or more of the items, and/or interface points for one or more of the items and/or a particular vehicle. In some embodiments, determining whether the items are interoperable and/or operable with a particular vehicle may include analyzing specific item constraints with respect to the items and/or the particular vehicle. These constraints may include any type of factor that may limit the operability of a particular item. For example, the constraints may include heat tolerances, space clearances (e.g., to allow for material expansion due, for example, to varying operation temperatures), legal constraints within a particular jurisdiction, etc.

In some embodiments, the decision block 504 may be optional or omitted. For example, in some cases, a user may identify the plurality of items as interoperable. In some cases, the decision block 504 may indicate that items are not interoperable, but a user may override the determination.

If it is determined at the decision block 504 that at least one of the items is not interoperable with the other items of the plurality of items, or a vehicle, the interactive computing system 310 at block 506 alerts the user that at least one item from the plurality of items is not interoperable with the plurality of items and/or the vehicle. At decision block 508, the interactive computing system 310 determines whether an alternative item can be identified for the at least one item that is not interoperable with the remaining items of the priority of items, and/or the vehicle. If an alternative item cannot be identified at the decision block 508, the process 500 may end. Alternatively, or in addition, the user may be alerted that an alternative item cannot be identified.

If an alternative item can be identified at the block 508, the recommendation engine 352 recommends the alternative item to a user. In some cases, multiple alternative items may be identified as part of the decision block 508. In such cases, the block 510 may include recommending each of the alternative items. Alternatively, the block 510 may include selecting a subset of the identified alternative items for presentation to a user.

In certain embodiments, one or more of the alternative items may be selected for inclusion in a preview image. The alternative items included in the preview image may be selected automatically or by a user. In some embodiments, one or more of the blocks 506, 508, 510 may be optional or omitted.

If it is determined at the decision block 504 that the plurality of items are interoperable, interactive computing system 310 identifies at block 512 one or more interface points for each item from the plurality of items. In some cases, interface points are only identified for a subset of the plurality of items. For example, if one of the items includes a decal, an interface point may or may not be associated with the item. In certain embodiments, the operations of the block 512 may be performed as part of the decision block 504. Thus, in such cases, the block 512 may be omitted.

At block 514, the image generator 358 may position three-dimensional models of each item from the plurality of items with respect to the interface points of the remaining items from the plurality of items to obtain a composite three-dimensional scene and/or rendered image. Further, the block 514 may include positioning at least one of the items with respect to an interface point from a vehicle, such as a vehicle depicted in a received image. In some cases, the block 514 may include accessing 3D models for each of the plurality of items from an item models repository 344.

At block 516, the interactive computing system 310 provides a representative rendered image (which may be either a 2D or 3D image, depending on display capability of the user device) of the composite three-dimensional scene to the user computing device 302. In some cases, the block 516 may include performing one or more operations associated with the blocks 416 and 418. Moreover, in some cases, the representative rendered image may illustrate the plurality of items with respect to the vehicle. For example, the plurality of items may be illustrated as installed or connected to the vehicle. Further, in some cases, multiple sets of the plurality of items may be illustrated. For example, if the plurality of items includes a bolt, a nut, and a brake caliper, multiple sets of the three items may be illustrated in the representative rendered image, either in isolation or with respect to the user's vehicle.

Terminology

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A computer-implemented method comprising:
    as implemented by one or more computing devices configured with specific computer-executable instructions,
        accessing an image from a continuous stream of images that depicts at least a portion of a vehicle;
        analyzing the image to determine spatial characteristics of the portion of the vehicle;
        identifying a vehicle interface depicted in the image, the vehicle interface comprising a connection location at which one or more items can be connected to the vehicle;
        annotating the image with an identification of a location of the vehicle interface to obtain an annotated image;
        providing the annotated image to a user device for presentation to a user while the user device is capturing subsequent images from the continuous stream of images;
        receiving a selection of an item for potential connection with the vehicle interface;
        accessing a three-dimensional (3D) model for the item;
        accessing a 3D model for the vehicle, wherein the 3D model for the vehicle represents at least the portion of the vehicle;
        transforming the 3D model for the item and the 3D model for the vehicle based at least in part on the spatial characteristics of the portion of the vehicle;
        creating a 3D image scene by positioning the 3D model for the item with respect to the 3D model for the vehicle such that an item interface of the item is aligned with respect to the vehicle interface;
        identifying a second vehicle interface, wherein creating the 3D image scene further comprises positioning a second instance of the 3D model for the item with respect to the 3D model for the vehicle based at least in part on the second vehicle interface; and
        generating a display image based at least in part on a rendering of the 3D image scene.

2. The computer-implemented method of claim 1, wherein the vehicle interface is located between at least two components of the vehicle.

3. The computer-implemented method of claim 2, wherein creating the 3D image scene further comprises removing a portion of the 3D model for the vehicle corresponding to a component from the at least two components.

4. The computer-implemented method of claim 1, wherein the vehicle interface is identified based at least in part on the selection of the item.

5. The computer-implemented method of claim 1, further comprising identifying a vehicle component included in the portion of the vehicle based at least in part on context information included in the image.

6. The computer-implemented method of claim 5, wherein the spatial characteristics of the portion of the vehicle are determined based on the identified vehicle component and without using a reference marker.

7. The computer-implemented method of claim 5, further comprising:
    determining whether the vehicle component comprises an original component, wherein the original component comprises a component included by the manufacturer of the vehicle; and
    in response to determining that the vehicle component is not an original component:
        identifying the vehicle component; and
        accessing a 3D model for the vehicle component, wherein creating the 3D image scene further comprises positioning the 3D model for the vehicle component with respect to the 3D model for the vehicle based at least in part on a location of a depiction of the vehicle component in the image.

8. The computer-implemented method of claim 7, wherein the vehicle interface is on the vehicle component.

9. The computer-implemented method of claim 1, wherein transforming the 3D model for the item and the 3D model for the vehicle comprises rotating, translating, and/or scaling the 3D model for the item and/or the 3D model for the vehicle.

10. The computer-implemented method of claim 1, wherein vehicle interface dimensions of the vehicle interface are determined based on an identity of the vehicle, and wherein a set of items available for selection by a user are filtered based at least in part on the vehicle interface dimensions.

11. A system comprising:
    an electronic data store configured to at least store specific computer-executable instructions; and
    an interactive computing system comprising computer hardware in communication with the electronic data store, the interactive computing system configured to execute the specific compute-executable instructions to at least:
        access an image that depicts at least a portion of a vehicle;
        analyze the image to identify the vehicle;
        receive a selection of an item for potential addition to the portion of the vehicle;
        determine an item type of the selected item;
        identify a plurality of vehicle connection interfaces based at least in part on the item type, wherein the item type is designed to attach to the vehicle at one or more of the plurality of vehicle connection interfaces;
        access a three-dimensional (3D) model for the selected item;

access a 3D model for the vehicle;

scale the 3D model for the vehicle and the 3D model for the selected item based at least in part on the scale of the portion of the vehicle depicted in the image;

create an annotated image corresponding to the image, wherein a location of two or more of the plurality of vehicle connection interfaces are annotated in the annotated image;

provide the annotated image to a user device for presentation to a user;

receive a selection of at least one vehicle connection interface from the annotated vehicle connection interfaces;

create a 3D image scene based at least in part on a placement of the 3D model for the selected item with respect to the 3D model for the vehicle, wherein creating the 3D image scene further comprises placing one or more instances of the 3D model of the selected item with respect to the 3D model for the vehicle based at least in part on the received selection of the at least one vehicle connection interface; and render a display image based at least in part on the 3D image scene.

12. The system of claim 11, wherein the interactive computing system is further configured to execute the specific computer-executable instructions to at least determine whether the selected item fits the vehicle by determining whether the 3D model for the selected item mates with the 3D model for the vehicle at the at least one vehicle connection interface within a threshold degree of error.

13. The system of claim 12, wherein the threshold degree of error is based at least in part on the item type and/or the material properties of the selected item.

14. The system of claim 12, wherein the interactive computing system is further configured to execute the specific computer-executable instructions to at least annotate the at least one vehicle connection interface within the display image to indicate whether the selected item fits the vehicle.

15. The system of claim 12, wherein, in response to determining that the selected item does not fit the vehicle, the interactive computing system is further configured to execute the specific computer-executable instructions to at least:

identify an alternative item that does fit the vehicle; and output a recommendation of the alternative item.

16. The system of claim 11, wherein the interactive computing system is further configured to execute the specific computer-executable instructions to at least modify a view of the display image corresponding to movement of the user device that captures a continuous stream of images of one or more portions of the vehicle, wherein movement of the user device is detected based at least in part on a comparison of the image with a subsequent image from the continuous stream of images.

17. The system of claim 11, wherein the interactive computing system is further configured to execute the specific computer-executable instructions to at least:

determine, based at least in part on the image, whether the vehicle includes an aftermarket component, wherein the aftermarket component comprises a component that is not provided by the manufacturer of the vehicle and that modifies a manufacturer specification for the vehicle; and in response to determining that the vehicle includes an aftermarket component the interactive computing system is further configured to execute the specific computer-executable instructions to at least:

identify the aftermarket vehicle component; and access a 3D model for the aftermarket vehicle component, wherein creating the 3D image scene further comprises positioning the 3D model for the aftermarket vehicle component with respect to the 3D model for the vehicle based at least in part on a location of a depiction of the aftermarket vehicle component in the image.

18. The system of claim 17, wherein the interactive computing system is further configured to execute the specific computer-executable instructions to at least generate the 3D model for the aftermarket vehicle component based at least in part on a portion of the image that depicts the aftermarket vehicle component.

19. A computer-readable, non-transitory storage medium storing computer executable instructions that, when executed by one or more computing devices, configure the one or more computing devices to perform operations comprising:

accessing a continuous stream of images that depict at least a portion of a vehicle;

analyzing a frame of the continuous stream of images to identify the vehicle;

identifying one or more vehicle connection nodes viewable in the frame;

annotating the frame with a location of the one or more vehicle connection nodes to obtain an annotated frame;

outputting, for presentation on a user device, the annotated frame;

receiving a selection of a vehicle connection node from the one or more vehicle connection nodes;

outputting, for presentation on the user device, a representation of one or more vehicle components capable of being attached to the selected vehicle connection node;

receiving a selection of a vehicle component from the one or more vehicle components;

receiving a selection of a second vehicle connection node;

accessing a three-dimensional (3D) model for the vehicle component;

accessing a 3D model for the vehicle;

scaling the 3D model for the vehicle and the 3D model for the selected vehicle component based at least in part on the scale of the portion of the vehicle depicted in the frame; and rendering a 3D image scene based at least in part on a placement of the 3D model for the selected vehicle component with respect to the 3D model for the vehicle, wherein the placement of the 3D model for the selected vehicle component is determined based at least in part on the selected vehicle connection node, and wherein rendering the 3D image scene further comprises positioning a second instance of the 3D model for the selected vehicle component based at least in part on the second selected vehicle connection node.

20. The computer-readable, non-transitory storage medium of claim 19, wherein the operations further comprise performing a transformation on the rendered 3D image scene to obtain a two dimensional (2D) image.

21. The computer-readable, non-transitory storage medium of claim 19, wherein the operations further comprise updating the 3D image scene based at least in part on movement of the user device.

* * * * *